United States Patent
Guo (10) Patent No.: US 7,572,646 B2
(45) Date of Patent: Aug. 11, 2009

(54) MAGNETIC RANDOM ACCESS MEMORY WITH SELECTIVE TOGGLE MEMORY CELLS

(75) Inventor: Yimin Guo, San Jose, CA (US)

(73) Assignee: MagIC Technologies, Inc., Milpitas, CA (US)

(*) Notice: Subject to any disclaimer, the term of this patent is extended or adjusted under 35 U.S.C. 154(b) by 0 days.

(21) Appl. No.: 12/151,217

(22) Filed: May 5, 2008

(65) Prior Publication Data

US 2008/0205131 A1 Aug. 28, 2008

Related U.S. Application Data

(62) Division of application No. 11/340,989, filed on Jan. 27, 2006, now Pat. No. 7,368,301.

(51) Int. Cl.
*H01L 21/00* (2006.01)
(52) U.S. Cl. .......................... 438/3; 438/785
(58) Field of Classification Search .................... 438/3, 438/875, E21.208
See application file for complete search history.

(56) References Cited

U.S. PATENT DOCUMENTS

| 6,335,890 | B1 | 1/2002 | Reohr et al. |
| 6,545,906 | B1 | 4/2003 | Savtchenko et al. |
| 6,714,446 | B1 | 3/2004 | Engel |
| 6,956,764 | B2 | 10/2005 | Engel et al. |
| 2005/0153063 | A1 | 7/2005 | Janesky et al. |
| 2005/0237796 | A1 | 10/2005 | Kim et al. |

OTHER PUBLICATIONS

"A 0.18um 4Mb Toggling MRAM," by M. Durlam et al., IEDM Technical Digest 2003, Session 34, paper #6, 3 pages.
"A Low Power 1Mbit MRAM based on 1T1MTJ bit Cell Integrated with Copper Interconnects," by M. Durlam et al., VLSI Conference 2002, Motorola, pp. 1-22.

*Primary Examiner*—Long Pham
(74) *Attorney, Agent, or Firm*—Saile Ackerman LLC; Stephen B. Ackerman (57) ABSTRACT

A toggle MTJ is disclosed that has a SAF free layer with two or more magnetic sub-layers having equal magnetic moments but different anisotropies which is achieved by selecting $Ni_{\sim 0.8}Fe_{\sim 0.2}$ for one sub-layer and CoFeB or the like with a uni-axial anisotropy of 10 to 30 Oe for the higher anisotropy sub-layer. When a field is applied at <10° angle from the easy axis, magnetic vectors for the two sub-layers rotate to form different angles from the easy axis. A method is also described for selectively writing to bits along a word line that is orthogonal to bit line segments and avoids the need to "read first". A bipolar word line pulse with two opposite pulses separated by a no pulse interval is applied in the absence of a bit line pulse to write a "0". A bit line pulse opposite the second word line pulse writes a "1".

6 Claims, 9 Drawing Sheets

MAGNETIC RANDOM ACCESS MEMORY WITH SELECTIVE TOGGLE MEMORY CELLS

This is a Divisional application of U.S. patent application Ser. No. 11/340,989, filed on Jan. 27, 2006 now U.S. Pat. No. 7,368,301, which is herein incorporated by reference in its entirety, and assigned to a common assignee.

FIELD OF THE INVENTION

The invention relates to an MRAM structure having a magnetic region comprised of a synthetic anti-ferromagnetic (SAF) free layer in which sub-layers thereof are anti-parallel coupled and have equal magnetic moments but unequal anisotropies that enables writing to selected MTJ cells without a "read first" requirement.

BACKGROUND OF THE INVENTION

Magnetic random access memory (MRAM) that incorporates a magnetic tunneling junction (MTJ) as a memory storage cell is a strong candidate to provide a high density, fast (1-30 ns read/write speed), and non-volatile storage solution for future memory applications. An MRAM array is generally comprised of an array of parallel first conductive lines on a horizontal plane, an array of parallel second conductive lines on a second horizontal plane spaced above and formed in a direction perpendicular to the first conductive lines, and an MTJ formed at each location where a second conductive line crosses over a first conductive line. A first conductive line may be a word line while a second conductive line is a bit line or vice versa.

Figure 1:
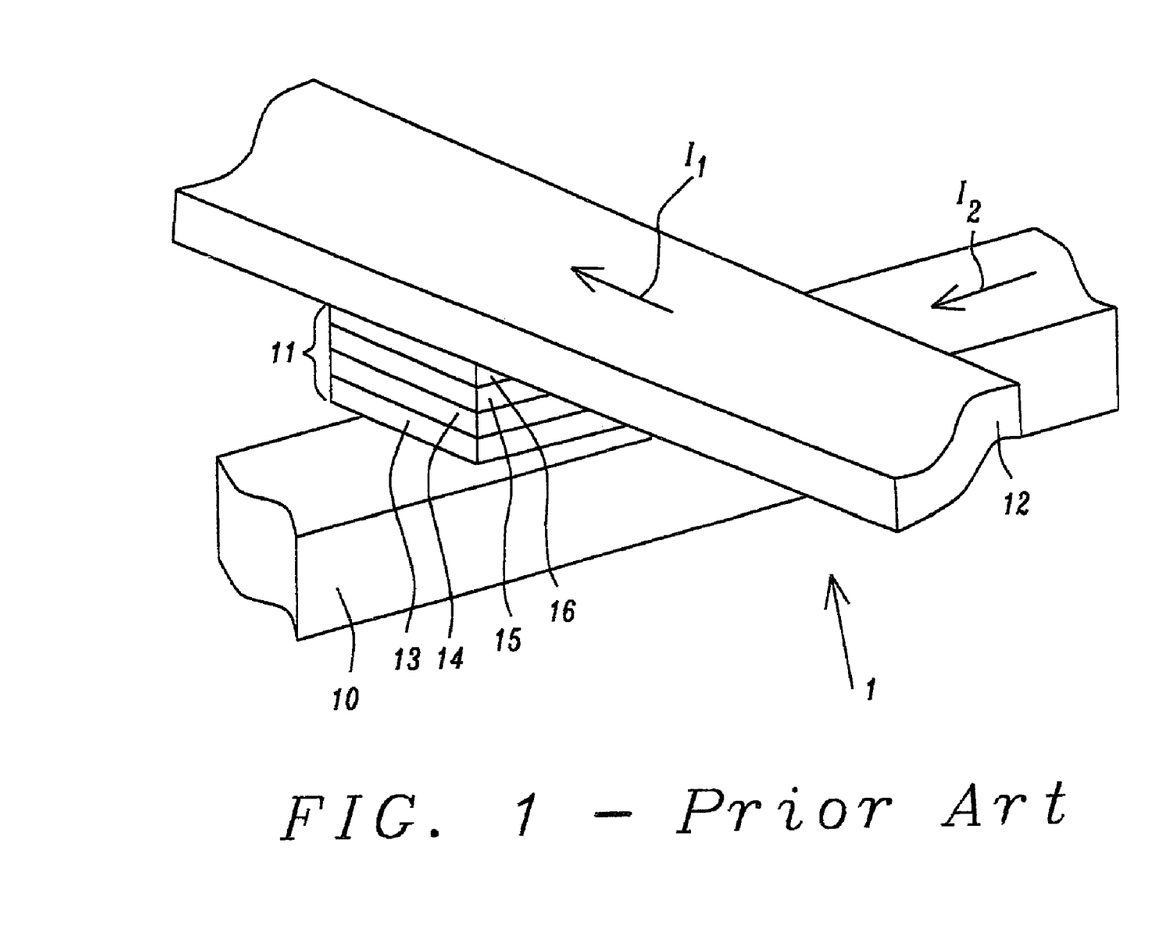
FIG. 1 is an oblique view showing a conventional MRAM structure in which an MTJ is formed between a first conductive line and a second conductive line.

Referring to FIG. 1, a conventional MRAM structure 1 is shown in which an MTJ 11 is formed between a first conductive line 10 and a second conductive line 12. In this example, the first conductive line is a word line and the second conductive line is a bit line although the terms are interchangeable. A conductive line may also be referred to as a digit line, row line, data line or column line. The word line 10 and bit line 12 are used for writing data into the MTJ 11. The MTJ consists of a stack of layers with a configuration in which two ferromagnetic layers are separated by a thin non-magnetic insulating layer such as $Al_2O_3$, $AlN_xO_y$, or MgO which is called a tunnel barrier layer. In a so-called bottom spin valve configuration, the bottom portion 13 is a composite layer with a lower seed layer, a middle anti-ferromagnetic (AFM) layer, and an upper pinned layer (first ferromagnetic layer). The AFM layer is exchange coupled to the pinned layer and thereby fixes the magnetization (magnetic moment) direction of the pinned layer in a preset direction. Above the pinned layer is the tunnel barrier layer 14. The second ferromagnetic layer is a free layer 15 on the tunnel barrier layer and has a magnetization direction that can be changed by external magnetic fields. To maintain data against erasure or thermal agitation, an in-plane uni-axial magnetic anisotropy is needed for the free layer 15. The top layer in the MTJ 11 is generally a cap layer 16.

During a write operation, an electrical current $I_1$ in bit line 12 and a current $I_2$ in word line 10 yield two magnetic fields on the free layer 15. The magnetic fields conform to a right hand rule so that a first field is generated along a first axis (easy axis) in the plane of the free layer and a second field is produced in a direction orthogonal to the first axis and along a hard axis in the free layer. In response to the magnetic fields generated by currents $I_1$ and $I_2$, the magnetic vector in the free layer is oriented in a particular stable direction that represents a memory state. The resulting magnetic vector orientation depends on the direction and magnitude of $I_1$ and $I_2$ and the properties and shape of the free layer 15. Generally, writing a zero "0" requires the direction of either $I_1$ or $I_2$ to be different than when writing a one "1". Thus, the magnetization direction of the free layer may be switched from a "+x" to a "−x" direction, for example, that corresponds to a change in the memory state from a "0" to a "1" or vice versa.

The magnitude of the magnetic field used to switch the magnetic vector is proportional to the amplitude of $I_1$ and $I_2$. The amplitude of $I_1$ and $I_2$ is on the order of several milli-Amperes for most designs. As the size of MTJs shrinks to 0.1 micron or smaller, the switching fields are expected to become larger and switch transistors will demand a larger amount of chip area. It is desirable to reduce power consumption and this adjustment is achieved in some cases by increasing the field per current ratio of the conductor. A prior art method for increasing the field per current ratio is to provide a magnetic liner or cladding layer on one or more sides of a conductive line. Examples of cladding layers are described by Naji et al. in "A low power 1 Mbit MRAM based on ITIMTJ bit cell integrated with Copper Interconnects", VLSI Conf. (2002).

The typical writing scheme is a "half select" scheme where a bit line and word line each generate half the required write field for switching the selected MTJ cell. However, the energized word and bit lines reduce the magnetic reversal energy barrier in the other cells along their respective word and bit lines. This condition makes these "half-selected" cells more susceptible to having their magnetic states unintentionally switched when the selected cell is written.

In U.S. Pat. No. 6,335,890, an architecture for selectively writing one or more magnetic memory cells in a MRAM device comprises at least one write line including a global write line conductor and a plurality of segmented write line conductors connected thereto. The global write line conductor is substantially isolated from the memory cells.

An MRAM with a MTJ cell structure and switching mechanism that does not suffer from the half select problem of the conventional MRAM has been proposed by Motorola. This "Savtchenko" cell structure and switching mechanism is described in U.S. Pat. No. 6,545,906 and by M. Durlam et al. in "A 0.18 micron 4 Mb Toggling MRAM", IEDM Technical Digest 2003, Session 34, paper #6. In this type of MRAM, the MTJ cell's ferromagnetic free layer is a synthetic anti-ferromagnet (SAF) that may be a multilayer of two ferromagnetic sublayers of nearly identical magnetic moment, separated by an anti-ferromagnetic coupling layer that maintains an anti-parallel alignment of the moments of the two sublayers. In a SAF free layer, the sublayer which directly contacts the MTJ tunnel barrier layer is the sensing layer. The pinned layer on the opposite side of the barrier layer is the reference layer. When the sensing layer and pinned layer magnetization directions are parallel, the MTJ cell has low resistance, and when the magnetization directions are anti-parallel, the cell has a high resistance.

The Savtchenko type of MRAM uses two orthogonal writing or programming lines, but with the MTJ cell's axis aligned 45 degrees to each of the lines. The SAF free layer responds to the applied magnetic fields differently than a conventional single ferromagnetic free layer. Writing occurs by a process called "toggle" writing in which a two phase programming pulse sequence incrementally rotates the SAF free layer moment or magnetization direction 180 degrees so the MRAM is sometimes called a "toggling" MRAM and the memory cell a "toggle" cell. Because of the cell's 45 degree angle to the programming lines and its field response, the field from a single programming line cannot switch the magnetization of a half selected cell and thereby results in an MRAM with enhanced cell selectivity.

The conventional toggling writing process always changes the selected cell, independent of the sensing layer magnetization direction since the two magnetic sub-layers in the SAF are symmetrical. The toggling MRAM is a "read before write" MRAM which means all the toggle memory cells have to be read first to find their magnetic states and determine whether toggling writing is needed. This "read before write" scheme significantly reduces the write cycle time.

However, it would be desirable to further reduce the write cycle time by implementing a new toggle MTJ cell design to enable a direct write process of selected cells to desired states. A direct writing scheme without the need to know the previous magnetic states of the selected cells would greatly improve the writing speed.

SUMMARY OF THE INVENTION

One objective of the present invention is to provide a selective toggling MRAM structure in which MTJ cells can be selectively written to without first employing a read process to determine their memory states.

A further objective of the present invention is to provide a MTJ having a SAF free layer in which sub-layers thereof are anti-parallel coupled and have essentially equal magnetic moments but unequal anisotropies.

Yet another objective of the present invention is to provide a write process for the toggle MTJ cells having a SAF free layer in which sub-layers thereof are anti-parallel coupled and have essentially equal magnetic moments but different anisotropies.

These objectives are achieved in an MRAM structure comprised of an MTJ that is sandwiched between a first conductive line and second conductive line hereafter referred to as bit line and word line, respectively. In one aspect, there is a bit line having a top surface that contacts the bottom of the MTJ and a word line aligned orthogonally to the bit line that has a bottom surface in contact with the top surface of the MTJ. The MTJ may have a bottom spin valve configuration wherein a seed layer, AFM layer, pinned layer, tunnel barrier, free layer, and cap layer are sequentially formed on the bit line. Preferably, the free layer has a synthetic anti-ferromagnetic (SAF) configuration wherein a first sub-layer, coupling layer, and second sub-layer are sequentially formed on the tunnel barrier. A key feature is that the first sub-layer and second sub-layer have essentially the same magnetic moment but different anisotropies. The different anisotropies result from selecting different materials for the two sub-layers. The first sub-layer preferably has a higher anisotropy and is made of soft magnetic material such as CoFeB, CoNiFe, CoFeB/NiFe, CoNiFe/NiFe, or is comprised of two soft magnetic sub-sublayers that are coupled by Ru as in NiFe/Ru/NiFe. The second sub-layer has a lower anisotropy and is comprised of a soft magnetic material such as $Ni_{-0.8}Fe_{-0.2}$.

Alternatively, the SAF free layer may be comprised of four sub-layers each having the same magnetic moment. Preferably, the outer sub-layer that is the greatest distance from the tunnel barrier has a larger anisotropy than the inner three sub-layers. Moreover, each of the adjacent sub-layers are anti-ferromagnetically coupled through a coupling layer such as Ru and the two inside sub-layers closest to the tunnel barrier layer are strongly anti-parallel coupled.

In one embodiment, the easy axis of the SAF free layer is parallel to the bit line and normal to the word line. For this design, writing to selected MTJ cells in a selective toggle mode comprises applying a current with a positive pulse followed by a negative pulse (or a negative pulse followed by a positive pulse) along the selected word line that contacts the selected MTJ cells. To write "0" in each MTJ cell along the selected word line, no current flows through bit lines that contact the selected MTJ cells (bits) and the second pulse of the word line current writes the bits. In order to write "1" in each bit along the selected word line, a bit line current pulse overlays with the second pulse of the word line current. When the second word line current pulse is negative, the bit line pulse is positive. In this scheme, the combined magnetic fields generated by the second word line current pulse and bit line current pulse is sufficiently larger than the spin-flop field for the SAF free layer and thereby avoids writing a "0".

In a second embodiment, the easy axis of the SAF free layer bisects the angle formed by the intersection of a bit line and word line. The angle between the easy axis and bit line is the same as the angle between the easy axis and word line and may range from about 45° to 60°. During the selective write process, the sum of the fields generated by the word line current and bit line current is larger than its spin-flop field with sufficient margin and is parallel to the easy axis (+x) direction for writing "1" and in the opposite direction (−x) direction for writing "0". The falling edges of the word line current pulse and bit line current pulse are matched to overlap each other and use either longer current falling time or a multi-step falling edge.

DETAILED DESCRIPTION OF THE INVENTION

The present invention is an MRAM structure having a toggle MTJ cell design wherein a SAF free layer has at least two sub-layers that are anti-parallel coupled and have essentially equal magnetic moments but different anisotropies. The drawings are provided by way of example and are not intended to limit the scope of the invention. Although certain drawings depict a bit line formed below a MTJ and a word line above the MTJ, the designation for bit line and word line may be reversed. Moreover, the terms bit line and word line may be interchanged with other terms such as column line, row line, data line, and digit line. The MTJ may be a top MTJ, a bottom MTJ, or a multilayer MTJ as appreciated by those skilled in the art. "Write word line" and "write bit line" are terms that identify the word line and bit line used to write a certain MTJ cell. Although only one MTJ cell is shown in some drawings, it should be understood that there are a plurality of MTJ cells in an array that has multiple rows and columns on an MRAM chip. The present invention is also a method of selectively writing a "0" or "1" memory state in one or more toggle MTJ cells described herein.

Figure 2:
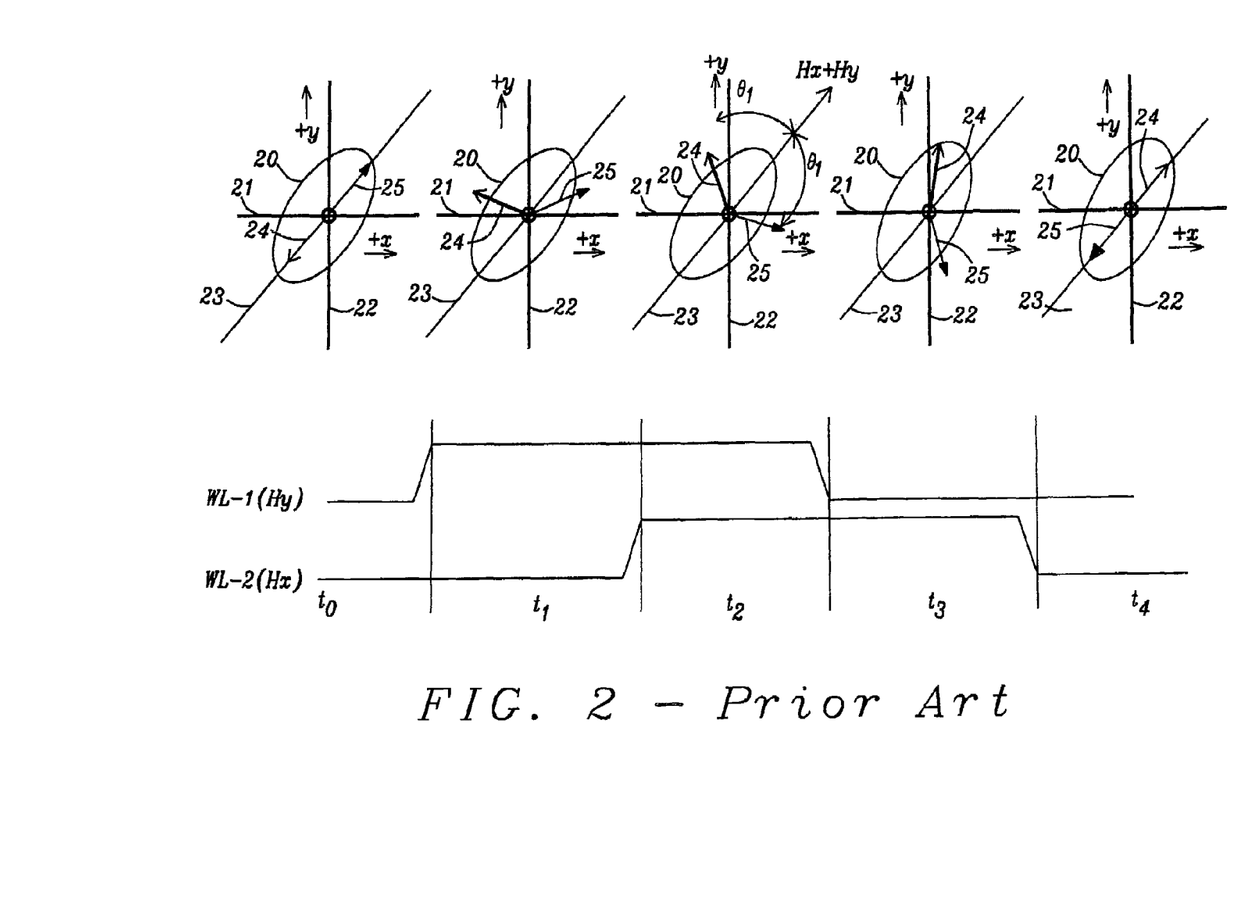
FIG. 2 is a time sequence diagram that illustrates how the magnetic vectors for two sub-layers of a SAF free layer in a conventional toggle MRAM are switched by sequentially applying magnetic fields in the "+x" direction followed by the "x+y" direction, "y" direction, and finally setting the applied field back to zero.

Referring to FIG. 2, the writing sequence for a conventional toggle MTJ cell is illustrated. A top-down view of an elliptically shaped MTJ cell 20 is depicted that is essentially centered at the intersection of an x-axis and y-axis that overlay on a first write line 21 and second write line 22, respectively. The first write line 21 contacts the bottom of the MTJ cell 20 while the second write line 22 contacts the top of the MTJ cell. The MTJ cell 20 has a stack of layers (not shown) comprised of a SAF free layer having a lower sub-layer or sub-layer 1 formed on a tunnel barrier layer (not shown), a middle coupling layer, and an upper sub-layer or sub-layer 2 formed on the coupling layer. Sub-layer 1 has a magnetic vector 24 oriented along an easy axis 23 that bisects the angle formed by the x and y axes and sub-layer 2 has a magnetic vector 25 oriented opposite to that of magnetic vector 24. The magnetic vectors 24, 25 have essentially the same magnitude and the two sub-layers have equal anisotropies. The easy axis of magnetization of the SAF free layer is the axis of anisotropy that can be induced by the shape of the MTJ cell or by the deposition process such as deposition in an applied magnetic field or at an angle of incidence. For an ellipse, the easy axis usually coincides with the long axis.

The orientations of the two magnetic vectors 24, 25 are shown during time intervals $t_0$-$t_4$. In a quiescent state during time interval $t_0$, no write line currents are applied and the magnetic vectors 24, 25 are oriented opposite each other along the easy axis 23. This condition may represent a memory state "0", for example. During interval $t_1$, a current in write line 22 (WL-1) generates a magnetic field (Hy) in the +y direction that causes both magnetic vectors 24, 25 to rotate in a clockwise manner. Note that the +y axis now bisects the angle formed by the magnetic vectors 24, 25. During interval $t_2$, currents in write line 21 and write line 22 (WL-2) generate magnetic fields Hy and Hx, respectively, that produce a net magnetic field along the easy axis 23 (anisotropy direction) between the +x and +y axes. Again, the magnetic vectors 24, 25 rotate in a clockwise manner (compared to their previous state). Of particular importance is the fact that the angle $\theta_1$ between magnetic vector 24 and the anisotropy direction (axis 23) is equal to angle $\theta_1$ between magnetic vector 25 and axis 23 because of the anisotropy symmetry in the two sub-layers. In interval $t_3$, the Hy field returns to zero but a current in the second write line 22 continues to exert a field (Hx) aligned in the +x direction. As a result, the magnetic vectors 24, 25 rotate once more in a clockwise direction and are now past their anisotropy hard axis instability points. Note that the +x axis bisects the angle formed by the magnetic vectors 24, 25. During the final interval ($t_4$), there is no current in either of the write lines 21, 22 and the magnetic vectors 24, 25 rotate clockwise to the nearest easy axis position. Note that the magnetic vectors 24, 25 have each rotated 180° compared with their original position (memory state "0") to effectively switch the memory state for the MTJ cell 20 to a "1". Each time the sequence $t_0$-$t_4$ is followed, the memory state of the MTJ cell 20 changes from a "1" to a "0" or vice versa, depending on the initial direction of magnetic vectors 24, 25.

Figure 3A:
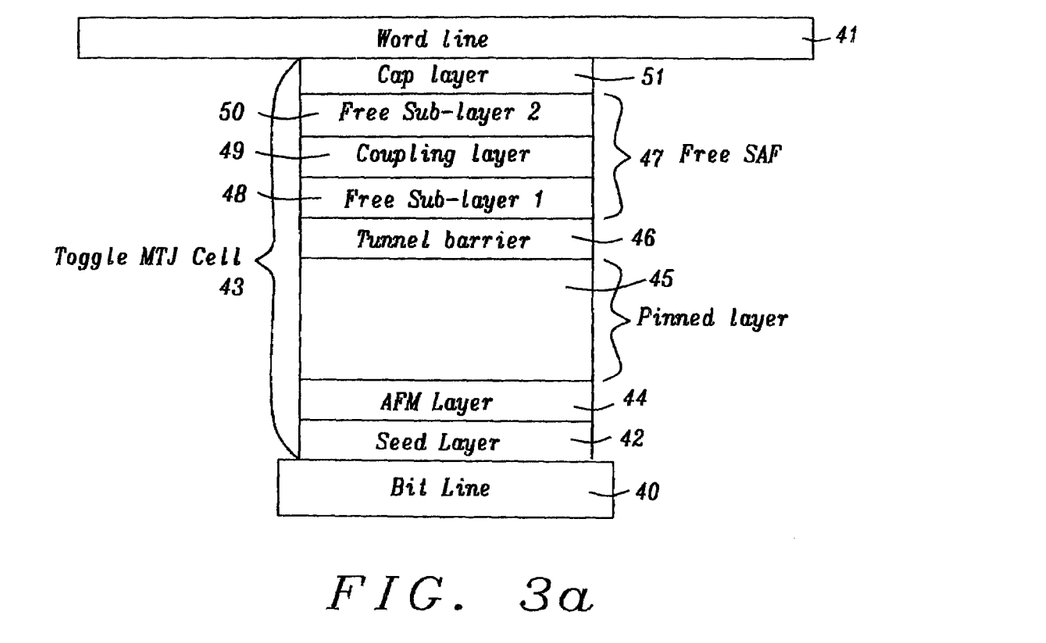
FIG. 3a is a cross-section of a toggle MTJ cell in which the free SAF layer has two sub-layers according to one aspect of the present invention.

FIG. 3a shows a cross-sectional view of a toggle MTJ cell 43 according to one embodiment of the present invention. The toggle MTJ cell 43 is formed between a bit line 40 and word line 41 in an MRAM structure (not shown). It should be understood that the positions of the bit line and word line could be reversed. In one aspect, the toggle MTJ cell 43 is comprised of a seed layer 42, AFM layer 44, pinned layer 45, tunnel barrier 46, free SAF layer 47, and cap layer 51 that are sequentially formed on the bit line 40. All layers in the MTJ cell 43 are typically sputter deposited in an Anelva sputter deposition system or the like that has sputter deposition chambers and at least one oxidation chamber.

The seed layer 42 may be made of NiFeCr, NiCr, Ta, Ru, or laminated films thereof that promote uniform and densely packed growth in subsequently formed layers. Above the seed layer 42 is an anti-ferromagnetic (AFM) layer 44 which may be comprised of PtMn, NiMn, OsMn, IrMn, RuMn, RhMn, PdMn, RuRhMn, or PtPdMn and is used to pin the magnetization direction in an overlying ferromagnetic (pinned) layer 45.

The pinned layer 45 is preferably comprised of one or more of Ni, Co, and Fe or an alloy thereof and has a thickness between about 10 and 200 Angstroms. The magnetization direction of the pinned layer 45 may be set along the MTJ cell's easy axis (not shown). Optionally, the pinned layer 45 may be a synthetic anti-parallel pinned (SyAP) layer in which two ferromagnetic layers (not shown) such as CoFe of slightly different thicknesses are separated by a thin Ru, Rh, or Ir coupling layer that maintains strong anti-parallel magnetic coupling between the two ferromagnetic layers as appreciated by those skilled in the art. In other words, the SyAP pinned layer has a sandwich configuration in which the magnetization direction of a lower ferromagnetic (AP2) layer may be fixed along the easy axis by the AFM layer 23. An upper ferromagnetic (AP1) layer has a magnetization direction anti-parallel to that of the AP2 layer that results in a small net magnetic moment for the pinned layer along the same axis as the AP2 magnetic moment. The SyAP configuration minimizes the stray field from the pinned layer magnetization.

A tunnel barrier layer 46 also known as an insulating layer is disposed on the ferromagnetic (pinned) layer 45. The tunnel barrier layer 46 may be formed by sputter depositing an Al layer on the pinned layer and then oxidizing to form an $AlO_x$ layer with a thickness of about 5 to 15 Angstroms before the remaining MTJ layers are sputter deposited. Alternatively, the tunnel barrier layer 46 may be made of TiOx, HfOx, MgO, or a lamination of one or more of the aforementioned oxides.

A key feature of the present invention is the SAF free layer 47 that in one embodiment has a configuration comprised of a first sub-layer 48, a coupling layer 49, and a second sub-layer 50 formed sequentially on the tunnel barrier layer 46. In the present invention, the two sub-layers 48, 50 have the same magnetic moments (one parallel and the other anti-parallel to the easy axis of the MTJ cell 43) but their anisotropies are intentionally selected to be different. Thus, the net magnetic moment of the SAF free layer 47 is essentially zero. A capping layer 51 made of a conductive material such as Cu, Ru, Ta, TaN, W or a composite layer is formed on the second sub-layer 50 to complete the toggle MTJ cell 43 and typically has a thickness of about 50 to a few hundred Angstroms. A plurality of MTJ cells in an MRAM array is formed from the stack of layers 42-51 by a well known photoresist patterning and etching sequence.

Different anisotropies for the two sub-layers in SAF free layer 47 can be achieved by selecting different materials for first sub-layer 48 and second sub-layer 50. In particular, a material having a larger anisotropy such as CoFeB, CoNiFe, or multi-layers such as CoFeB/NiFe, CoNiFe/NiFe, or NiFe/Ru/NiFe are chosen for the first sub-layer 48. The first sub-layer 48 has a thickness between 15 and 100 Angstroms and its uni-axial anisotropy is preferably between 10 and 30 Oersted (Oe). When a NiFe/Ru/NiFe multilayer configuration is employed as the first sub-layer 48, the net magnetic moment is adjusted to be equal to the second sub-layer 50. Typically, the Ru coupling layer thickness is about 8 Angstroms to afford very large anti-ferromagnetic coupling between the two sub-layers 48, 50. A soft magnetic material with a small anisotropy such as $Ni_{\sim 0.8}Fe_{\sim 0.2}$ and having a thickness of about 15 to 100 Angstroms is selected for the second sub-layer 50. The uni-axial anisotropy of the second sub-layer 50 is preferably 0 to 8 Oe or at least 5 Oe less than that of the first sub-layer 48.

Figure 3B:
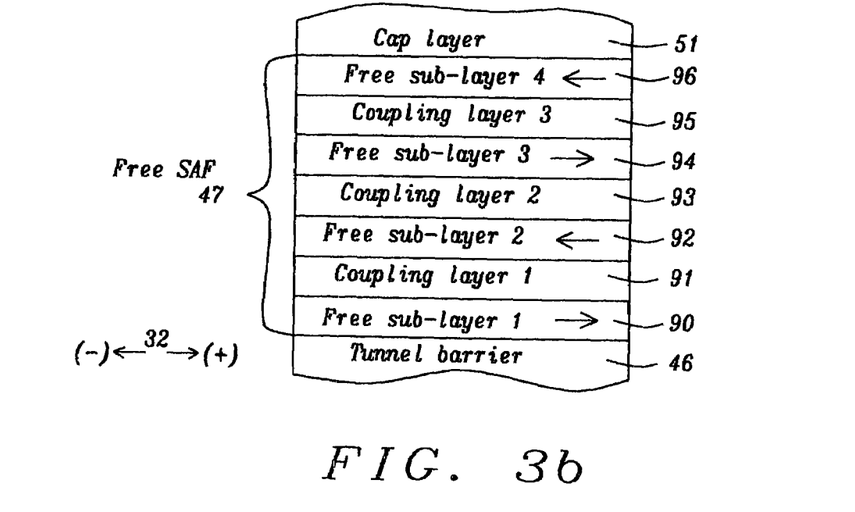
FIG. 3b is a cross-section of a free SAF layer portion of a toggle MTJ cell having four free sub-layers according to another aspect of the present invention.

In FIG. 3b, another embodiment of the present invention is depicted wherein the SAF free layer 47 is comprised of four sub-layers and three coupling layers. The first sub-layer 90 is disposed on the tunnel barrier layer 46 and may have a magnetic moment (vector) aligned along the easy axis 32 or optionally along the x-axis (not shown). There is a first coupling layer 91 on the first sub-layer 90 and a second sub-layer 92 formed thereon that is strongly anti-parallel coupled to the first sub-layer. The first and second sub-layers 90, 92 preferably have the same magnetic moments and anisotropies. Above the second sub-layer 92 is a second coupling layer 93 that may be made of the same material as in the first coupling layer 91 such as Ru. There is a stack comprised of a third sub-layer 94, a third coupling layer 95, and a fourth sub-layer 96 sequentially formed on the second coupling layer 93. The third coupling layer enables anti-parallel coupling between the third and fourth sub-layers 94, 96. The magnetic vectors of the first and third sub-layers 90, 94 are aligned in the same direction along the (+) direction of the easy axis 32, for example, while the magnetic vectors for second and fourth sub-layers 92, 96 are in the opposite direction along easy axis.

An important requirement is that the anisotropy for the first sub-layer 90 or fourth sub-layer 96 be greater than the anisotropy for the remaining three sub-layers. In one aspect, the fourth sub-layer 96 may have the same composition as described previously for sub-layer 48 and sub-layers 90, 92, 94 are preferably made of a soft magnetic material such as $Ni_{\sim 0.8}Fe_{\sim 0.2}$ or the like. Alternatively, the first sub-layer 90 may have the same composition as described previously for sub-layer 48 and sub-layers 92, 94, 96 are made of $Ni_{\sim 0.8}Fe_{\sim 0.2}$ or the like. However, all four sub-layers 90, 92, 94, 96 have equal magnetic moments in terms of magnitude.

Figure 4:
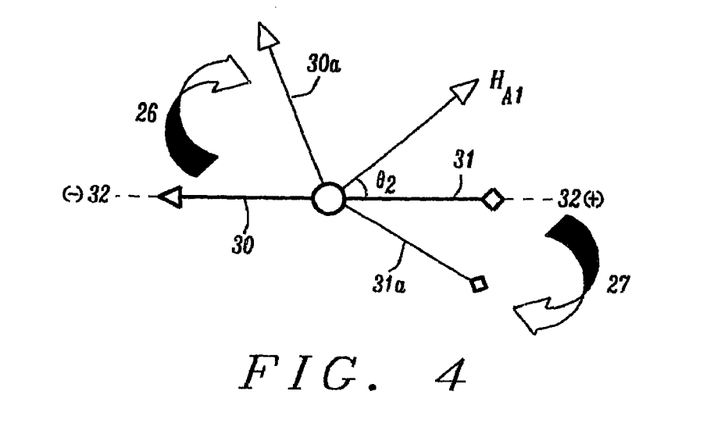
FIGS. 4 and 5 are diagrams that show the rotation of magnetic vectors for the sub-layers of the SAF free layer relative to the easy axis of the MTJ cell according to the present invention when a field with a large angle is applied away from the easy axis.

Referring to FIG. 4, a diagram shows how the magnetic vectors for two sub-layers in a SAF free layer according to one embodiment of the present invention rotate in response to an applied magnetic field that can be generated with current in bit line 40 and word line 41. In this example, magnetic vector 30 for the first sub-layer 48 in the toggle MTJ cell 43 is aligned along the easy axis 32 (negative direction) and magnetic vector 31 for the second sub-layer 50 is oriented in the opposite direction along the easy axis 32 during a quiescent state. When a magnetic field $H_{A1}$ is applied at a large angle $\theta_2$ away from the anisotropy direction (easy axis 32), the magnetizations of the two sub-layers rotate to form a scissoring structure facing the applied field $H_{A1}$. Magnetic vector 30 rotates clockwise 26 to a position represented by vector 30a and magnetic vector 31 undergoes a clockwise rotation 27 to a position represented by vector 31a. Since the magnetic vectors 30a, 31a have not moved beyond their anisotropic hard axis instability points, they will return back to their original positions (vectors 30, 31) when the applied field is removed. There is no change in memory state of the toggle MTJ cell 43 during this process.

Figure 5:
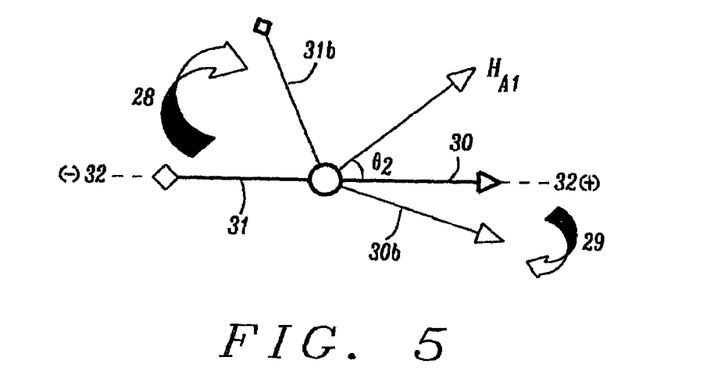

Referring to FIG. 5, a diagram shows how the magnetic vectors 30, 31 rotate in response to an applied magnetic field when their original orientations in a quiescent state are 180° opposite their respective positions in FIG. 4. Thus, if the positions of magnetic vectors 30, 31 in FIG. 4 represent a memory state "0", then the positions of vectors 30, 31 in FIG. 5 would represent a memory state "1". With an applied field $H_{A1}$ at a large angle $\theta_2$ away from the anisotropy direction, magnetic vector 30 has a clockwise rotation 29 to position 30b and magnetic vector 31 undergoes a clockwise rotation 28 to position 31b. Again, when the field is reduced to zero, the magnetization of the two sub-layers 48, 50 will revert back to the original positions (magnetic vectors 30, 31) and the memory state of the toggle MTJ cell 43 will remain unchanged. This behavior is similar to what is observed for a conventional toggle cell design as depicted in FIG. 2. For example, if the applied field Hy during interval $t_1$ in FIG. 2 were reduced to zero without proceeding to interval $t_2$, then the magnetic vectors 24, 25 for the two sub-layers would revert to their original positions depicted in interval $t_0$ and the memory state is not changed.

Figure 6:
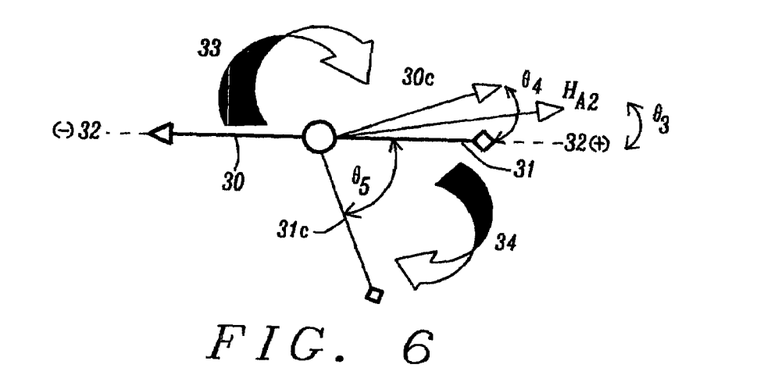
FIGS. 6 and 7a are diagrams showing the rotation of magnetic vectors for sub-layers of the SAF free layer relative to the easy axis in a toggle MTJ cell according to the present invention when a field is applied with a small angle away from the easy axis.

Referring to FIG. 6, a diagram shows how the magnetic vectors for two sub-layers in a SAF free layer of one embodiment of the present invention rotate in response to a magnetic field $H_{A2}$ that is applied along the anisotropy direction or at a small angle $\theta_3$ away from the easy axis 32. Magnetic vector 30 for the first sub-layer 48 in the toggle MTJ cell 43 is aligned along the easy axis 32 (arbitrarily assigned to the negative direction) and magnetic vector 31 for the second sub-layer 50 is oriented in the opposite direction along the easy axis 32 during a quiescent state. When the magnitude of the magnetic field $H_{A2}$ is beyond a critical value called the spin-flop field, Hsf, both magnetic vectors of the two sub-layers 48, 50 rotate to form a scissoring structure facing towards the applied field $H_{A2}$.

In the example shown in FIG. 6, the applied field $HA_2$ has a direction at an angle $\theta_3$ away from the (+) easy axis 32 direction. In a conventional toggle mode (FIG. 2) when a field is applied along the anisotropy direction as in interval $t_2$, the resulting magnetization angles $\theta_1$ of the magnetic vectors 24, 25 are equal with respect to the anisotropy direction. A different result occurs in the toggle MTJ cell 43 of the present invention because the magnetization angles of the two sub-layers 48, 50 with respect to the anisotropy direction (easy axis 32) are significantly different. In other words, the applied field $H_{A2}$ causes magnetic vector 30 to rotate clockwise 33 to a position represented by magnetic vector 30c at an angle $\theta_4$ from the anisotropy direction and magnetic vector 31 undergoes a clockwise rotation 34 to an angle $\theta_5$ away from the easy axis 32 wherein $\theta_4$ is substantially smaller than $\theta_5$. The magnetic vector 30c of sub-layer 48 is much closer to the anisotropy direction than the magnetic vector 31c for sub-layer 50. This condition occurs because the anisotropy for the first sub-layer 48 is much larger than the anisotropy for second sub-layer 50. In this case, when the magnetic field is reduced to zero, the magnetization of first sub-layer 48 moves to the nearby anisotropy direction along the (+) easy axis direction while the magnetization of second sub-layer 50 rotates to the direction opposite that of the first sub-layer 48 due to anti-ferromagnetic coupling. The new positions of magnetic vectors 30, 31 are 180° opposite to their starting positions before field $H_{A2}$ was applied and this represents a switch in memory state for MTJ cell 32 from a "0" to a "1".

Figure 7A:
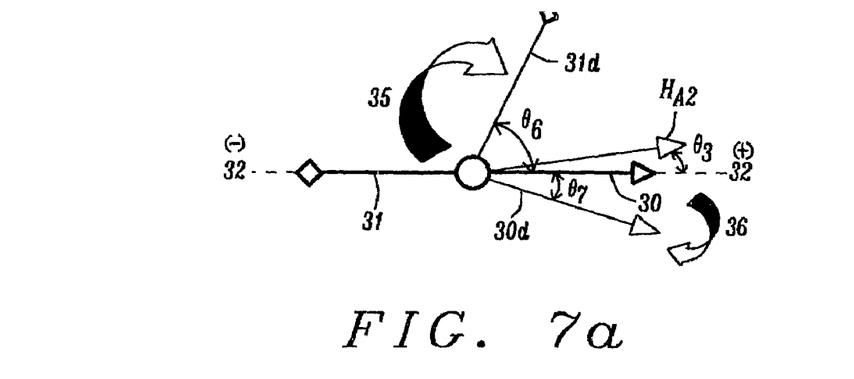

Referring to FIG. 7a, the diagram shows how the magnetic vectors 30, 31 rotate in response to an applied magnetic field when their original orientations in a quiescent state (memory state "1") are 180° opposite their original position in FIG. 6. Again, the applied field $H_{A2}$ has a direction along the (+) easy axis 32 direction or at a small angle $\theta_3$ away from the easy axis and the resulting magnetization angles of the two sub-layers 48, 50 with respect to the anisotropic direction are not equal but significantly different. Here, the applied field $H_{A2}$ causes magnetic vector 30 to rotate clockwise 36 to a position represented by magnetic vector 30d at an angle $\theta_7$ from the easy axis and magnetic vector 31 undergoes a clockwise rotation 35 to an angle $\theta_6$ away from the easy axis wherein $\theta_7$ is substantially smaller than $\theta_6$. The magnetic vector 30d of sub-layer 48 is much closer to the anisotropy direction (easy axis 32) than the magnetic vector 31d for sub-layer 50. When the magnetic field is reduced to zero, the magnetization of first sub-layer 48 moves to the nearby anisotropy direction along the (+) easy axis direction while the magnetization of second sub-layer 50 rotates to the direction opposite that of the first sub-layer 48 due to anti-ferromagnetic coupling. Thus, the original memory state "1" for the toggle MTJ cell 32 is retained since the magnetic vectors 30, 31 return to their original positions before $H_{A2}$ was applied.

In another embodiment (not shown), the field $H_{A2}$ may be applied at a small angle $\theta_3$ away from the (−) easy axis 32 direction when the magnetic vector 30 is in the (−) easy axis 32 direction in a quiescent state (memory state "0"). In that case, the magnetic vector 30 would rotate clockwise to an angle $\theta_7$ slightly away from the (−) easy axis. Meanwhile, under the influence of applied field $H_{A2}$, the magnetic vector 31 would rotate clockwise to an angle $\theta_6$ away from the (−) easy axis 32 direction wherein $\theta_7$ is substantially smaller than $\theta_6$. When the applied field is removed, the magnetic vectors return to their original directions (memory state "0") because the magnetization of the first sub-layer 48 moves to the nearby anisotropy direction along the (−) easy axis 32 while the magnetization of the second sub-layer 50 rotates to the direction opposite that of the first sub-layer 48 due to anti-ferromagnetic coupling.

In yet another embodiment (not shown), the field $H_{A2}$ may be applied at a small angle $\theta_3$ away from the (−) easy axis 32 direction when the magnetic vector 30 is in the (+) easy axis 32 direction in a quiescent state (memory state "1"). In that case, the magnetic vector 30 would rotate clockwise to an angle $\theta_4$ slightly away from the (−) easy axis. Meanwhile, under the influence of applied field $H_{A2}$, the magnetic vector 31 would rotate clockwise to an angle $\theta_5$ away from the (−) easy axis 32 direction. When the applied field is removed, the magnetization of the first sub-layer 48 moves to the nearby (−) anisotropy direction along (−) easy axis 32 while the magnetization of the second sub-layer 50 rotates to the direction opposite that of the first sub-layer 48 due to anti-ferromagnetic coupling. As a result, the memory state switches to a "0".

The write process for the toggle MTJ cell 43 can be summarized as follows: when the field is applied along the easy axis or at a small angle away from the easy axis in a direction that is essentially opposite that of the magnetic vector for the first sub-layer with higher anisotropy and the field exceeds the spin-flop field for the SAF free layer 47, then the memory state will be changed from a "1" to a "0" or from a "0" to a "1" after the field is removed. For those toggle MTJ cells 43 wherein the magnetic vector for the first sub-layer with higher anisotropy is in the same direction as the applied field or at an angle of more than about 10 degrees away from the easy axis, the memory state will not be changed during the aforementioned write process. This conclusion is true for a MTJ cell design where the bit line 40 and word line 41 are aligned at 45° to 60° angles with respect to the easy axis. A different write process is necessary when the easy axis overlays a bit line or word line and will be described in a later section.

A major benefit of the aforementioned write process is that there is no need to know the memory state before writing to the toggle MTJ cell 43. If writing a "1" to selected cells is desired, then a field is applied along or at a small angle away from the (+) easy axis direction. Those cells having a "1" memory state before the write sequence will retain that state and those cells having a "0" memory state before the write sequence will be changed to a "1" by the write process. Likewise, if writing a "0" to selected cells is desired, then a field is applied along or at a small angle away from the (−) easy axis direction. Those cells having a "0" memory state before the write sequence will retain that state and those cells having a "1" memory state before the write sequence will be changed to a "0" by the write process. This is advantageously different than in a conventional toggle cell design where all memory states are changed independent of their quiescent state before the write cycle is initiated.

Figure 7B:
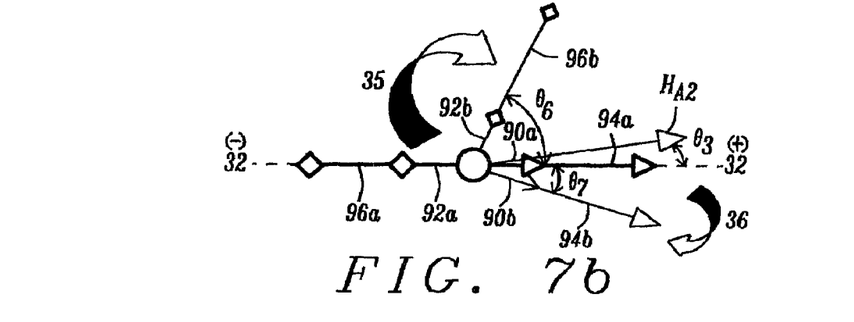
FIG. 7b is a diagram similar to FIG. 7a except an embodiment is depicted wherein there are four sub-layers in the SAF free layer and magnetic vectors for each sub-layer rotate clockwise in response to an applied field.

In FIG. 7b, a diagram is shown that demonstrates the rotation of magnetic vectors in an embodiment with four sub-layers in the SAF free layer such as depicted in FIG. 3b. The applied field $H_{A2}$ and angles of rotation $\theta_6$ and $\theta_7$ are the same as described with respect to FIG. 7a. In this case, the vectors 90a, 94a indicate the orientations of the sub-layers 90, 94, respectively, and the magnetic vectors 92a, 96a indicate the orientations of the sub-layers 92, 96, respectively in a quiescent state that may represent memory state "1".

When the applied field $H_{A2}$ has a direction along the (+) easy axis 32 direction or at a small angle $\theta_3$ away from the easy axis, the resulting magnetization angles of the two sub-layers 90, 94 with respect to the anisotropic direction are substantially different than those of sub-layers 92, 96. In this example, sub-layer 90 has a larger anisotropy than the sub-layers 92, 94, 96. Magnetic vectors 90a, 94a rotate clockwise 36 to positions represented by magnetic vectors 90b, 94b, respectively, at an angle $\theta_7$ from the easy axis. Meanwhile, magnetic vectors 92a, 96a undergo a clockwise rotation 35 to positions 92b, 96b, respectively, at an angle $\theta_6$ away from the easy axis wherein $\theta_7$ is substantially smaller than $\theta_6$. The magnetic vector 90b of sub-layer 90 is much closer to the anisotropy direction (easy axis 32) than the magnetic vectors 92b, 96b for sub-layers 92, 96. When the magnetic field is reduced to zero, the magnetization of first sub-layer 90 (and sub-layer 94) move to the nearby anisotropy direction along the (+) easy axis direction while the magnetization of sub-layer 92 (and sub-layer 96) rotate to the direction opposite that of the sub-layer 90 and sub-layer 94, respectively, due to anti-ferromagnetic coupling. Thus, the original memory state "1" for the toggle MTJ cell 43 is retained since the magnetic vectors 90, 92, 94, 96 return to their original positions before $H_{A2}$ was applied.

Those skilled in the art will appreciate that the toggle MTJ cell 43 having four sub-layers 90, 92, 94, 96 in the SAF free layer has memory states "0" or "1" that may be retained or switched depending on the initial orientation of the magnetic vectors for the various sub-layers and the direction and angle of the applied field. In addition to FIG. 7b, other magnetic responses to an applied field at a small angle away from the anisotropy direction are similar to those shown in FIGS. 4-6 except that two magnetic vectors (for two sub-layers) lie along each direction of the easy axis.

Those skilled in the art will also appreciate that the present invention also encompasses an embodiment wherein there are a plurality of "n" magnetic sub-layers and "n–1" coupling layers in the free SAF layer 47 of toggle MTJ cell 43 wherein "n" is an even number. This configuration has an anti-ferromagnetic coupling layer between adjacent magnetic sub-layers. Thus, there are n/2 magnetic sub-layers having a magnetic moment along the (–) easy axis direction and n/2 magnetic sub-layers with a magnetic moment along the (+) easy axis direction for a net magnetic moment of 0 in the SAF free layer. In this case, either the inner magnetic sub-layer on the tunnel barrier layer or the outer magnetic sub-layer adjacent to the cap layer has a higher anisotropy than the remaining magnetic sub-layers.

Figure 8:
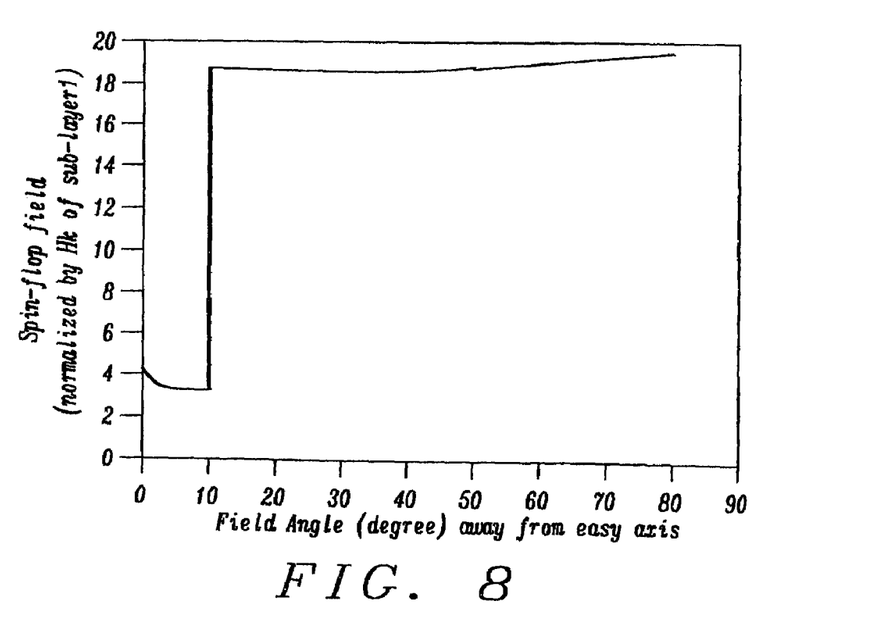
FIG. 8 shows a simulation result for flip-flop field as a function of field angle away from the easy axis in a toggle MTJ cell according to the present invention.

Referring to FIG. 8, a simulation result is shown for the spin-flop field as a function of the field angle away from the easy axis. For the examples in FIG. 6 and 7a, the field angle is $\theta_3$. In the simulation, the coupling field of the two sub-layers in the SAF free layer is taken to be 20 times Hk, the anisotropy of the first sub-layer. Note that only when the applied field is within a small angle where $\theta_3$ is less than about 10°, the magnetizations of the two sub-layers can be written with a reasonably small write field. Otherwise, when field angle $\theta_3$ exceeds a certain value, the applied field must be very large to almost saturate the sub-layer magnetizations in order to change their states.

Figure 9:
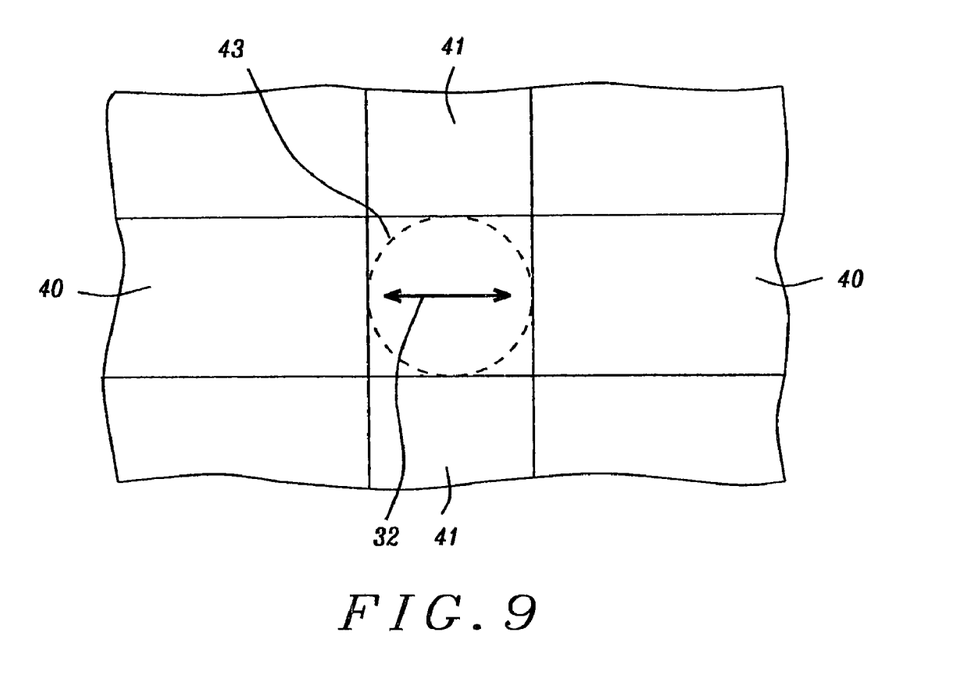
FIG. 9 is a top-view of a selective toggle MTJ cell having the easy axis (or anisotropy) of the two sub-layers of the SAF free layer aligned along a write bit line according to one embodiment of the present invention.

The present invention is also a method of selectively writing to one or more toggle MTJ cells in an MRAM structure. Referring to FIG. 9, the easy axis 32 of the SAF free layer 47 in toggle MTJ cell 43 is parallel to the bit line 40 and normal to the word line 41 according to one embodiment of the present invention. Although the MTJ cell 43 is shown as circular from a top-down view, it may optionally be shaped in the form of an ellipse, eye, or rectangle, for example.

Figure 10:
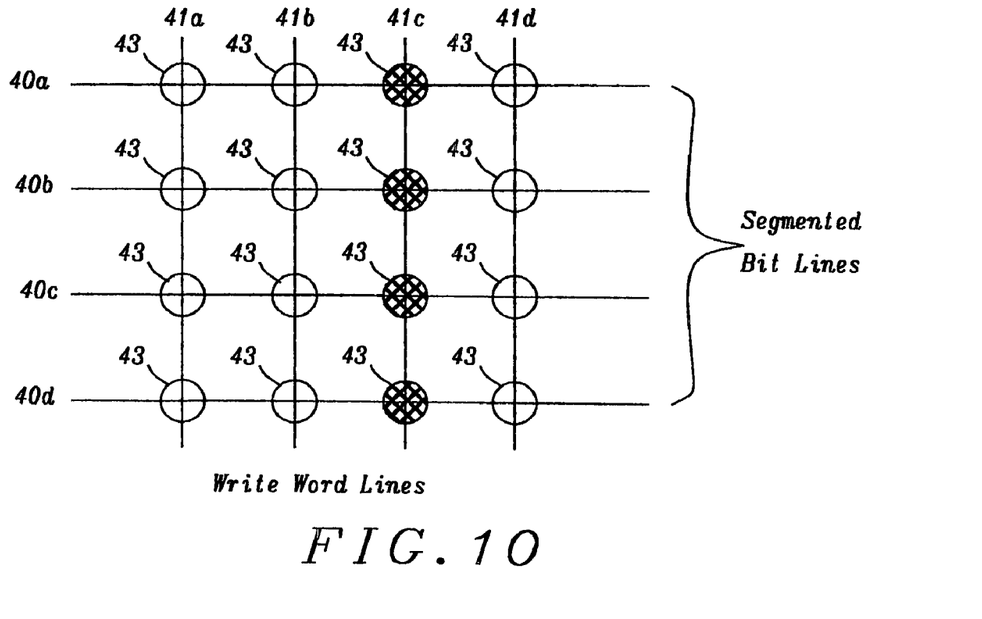
FIG. 10 is an enlarged top view of FIG. 9 that shows all bits (MTJ cells) along a selected word line are written to during the same write cycle.

In FIG. 10, a top view of a section of a MRAM containing a plurality of toggle MTJ cells 43 is shown wherein the easy axis of the SAF free layer has the same configuration as described with respect to FIG. 9. Note that write word lines 41a-41d and segmented bit lines 40a-40d are thinned to simplify the drawing. In this example, toggle MTJ cells 43 along write word line 41c will be selectively written. For the write process, a segmented bit line algorithm may be used as described in U.S. Pat. No. 6,335,890.

Figure 11:
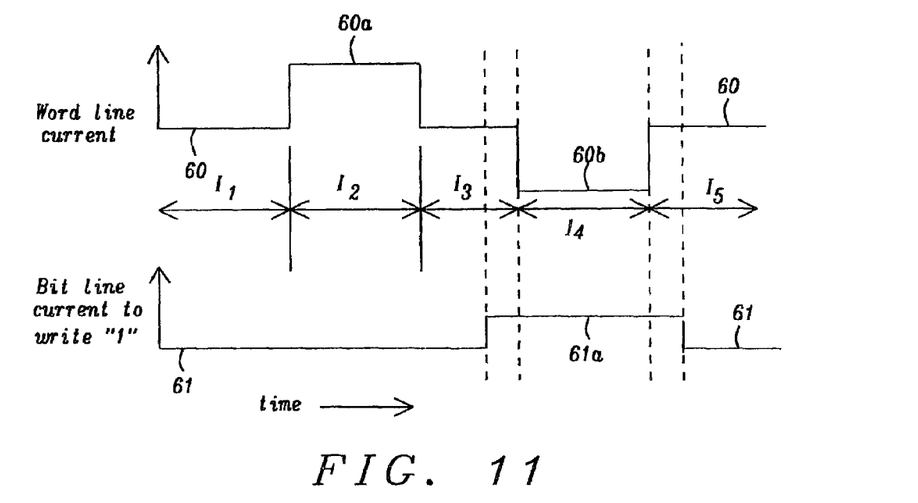
FIG. 11 is a diagram showing the bipolar word line current pulse used to write a "1" memory state to the selected MTJ cells in FIG. 10.

Referring to FIG. 11, a diagram illustrates how a bipolar current in the word line and a current in the bit line are applied to write a "1" in the selected toggle MTJ cells 43 also referred to as "bits". The write sequence may be divided into five time intervals $I_1$ through $I_5$ with a word line current 60 depicted along the same time axis as a bit line current 61. During interval $I_1$, there is no current pulse in either write word line 41c or in the segmented bit lines 40a-40d. A first current pulse 60a in the word line current 60 is applied with a certain amplitude during interval $I_2$ but there is no current pulse during the same time period in the bit line current 61. This first word line current pulse 60a effectively writes "1" to all of the selected bits along write word line 41c. During interval $I_3$, there is no current pulse in word line current 60 but near the end of the interval $I_3$, a bit line current pulse 61a is applied. If the in the first word line current pulse 60a is a positive pulse, then the bit line current pulse 61a is also positive. Otherwise, if the first word line current pulse 60a is negative, the bit line current pulse 61a is also negative.

Moving to interval $I_4$, a second current pulse 60b in word line 41c is applied and is opposite that of bit line current pulse 61a that continues through interval $I_4$. Therefore, if first word line current pulse 60a is a positive pulse, the second current pulse 60b is a negative pulse. Preferably current pulses 60a, 60b are equal in amplitude. Furthermore, the sum of the fields produced by current pulses 60b, 61a must be greater than a certain value so that the resulting field has an angle away from the easy axis of at least 10 degrees. Note that the bit line current pulse 61a overlays with the second word line current pulse 60b during interval $I_4$ and this yields a large applied field angle away from the easy axis. Because of this large angle, the spin-flop field of the SAF free layer is greatly increased to beyond the applied current field thereby avoiding writing a "0". During interval $I_5$, the bit line pulse 61a is removed and there is no word line pulse. Thus, the memory state of the toggle MTJ cell is not changed during interval $I_4$ and the selected bits retain the memory state "1" written during interval $I_2$.

Figure 12:
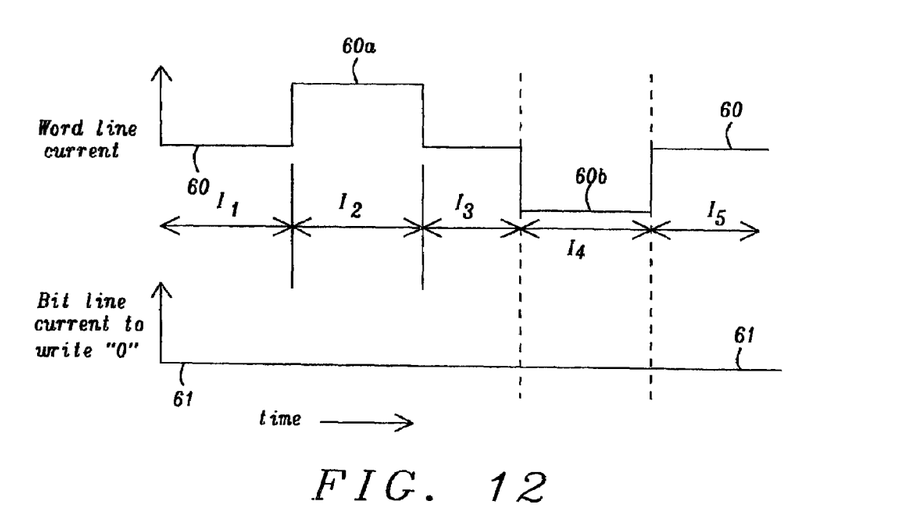
FIG. 12 is a diagram showing the bipolar word line current pulse and bit line current pulse used to write a "0" memory state to the selected MTJ cells in FIG. 10.

Referring to FIG. 12, the previously described word line current pulse sequence and an alternative bit line current is employed to write a "0" memory state in the selected bits along write word line 41c. The word line current pulse sequence remains the same as previously described through all five time intervals $I_1$-$I_5$. In this case, no bit line current pulse is applied so that the second word line current pulse 60b essentially writes a "0" in the selected bits during interval $I_4$.

Figure 13:
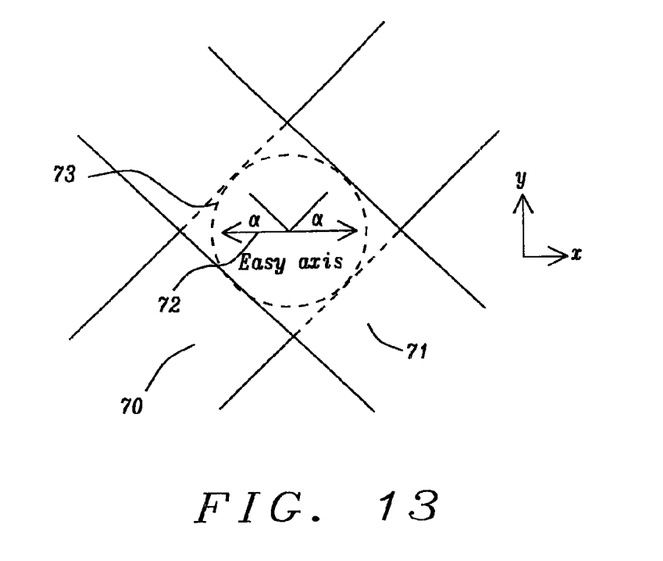
FIG. 13 is a top-view of a selective toggle MTJ cell wherein the write word line and write bit line have the same 45 to 60 degree angle away from the cell easy axis according to a second embodiment of the present invention.

In another embodiment depicted in FIG. 13, a selective toggle MTJ cell 73 may be formed at an intersection region of a bit line and word line wherein the bit line 70 and word line 71 have the same angle $\alpha$ of from 45° to about 60° away from the cell's easy axis 72. The cell's easy axis means the anisotropies for the two or more sub-layers in the SAF free layer (not shown) are aligned along said axis. From a top view, the toggle MTJ cell 73 may have a circular shape or may have anisotropy induced by an elliptical, rectangular, or eye shape, for example, wherein the long axis is typically the easy axis. In this scheme, each time a sufficient field along the easy axis (+) or (−) direction is generated by applying a current in the word line and bit line, the selected bit between the word line and bit line is written.

Figure 14:
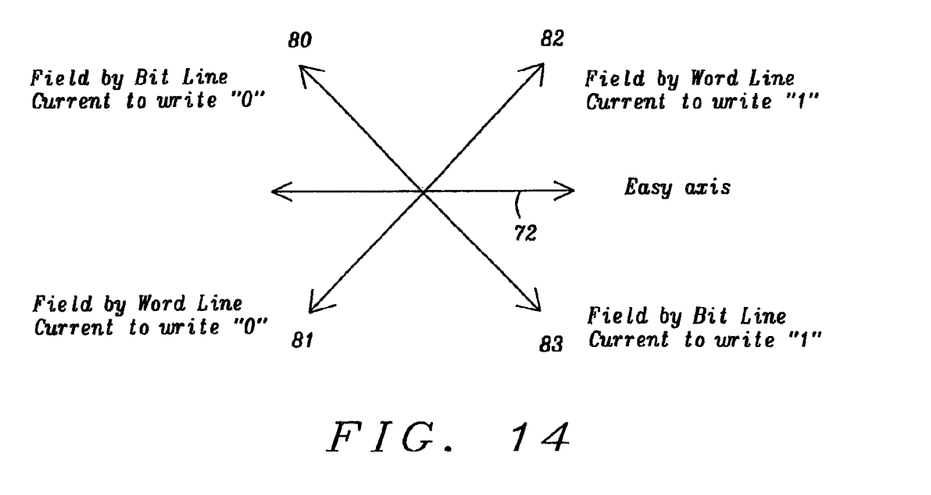
FIG. 14 is a diagram showing the direction of magnetic fields (relative to the easy axis) used to write "1" or "0" memory states to the MTJ cell in FIG. 13.

In FIG. 14, the sum of the fields generated by both word line current and bit line current during the write process is shown for the embodiment wherein the bit line 70 and word line 71 have the same angle α of from 45° to about 60° away from the cell's easy axis 72. The sum of the fields is larger than the SAF free layer's spin-flop field with sufficient margin and is parallel to the easy axis 72 (along the "+x" direction) for writing "1" and along the "−x" direction for writing "0". It should be understood that the applied field from each write line is generated orthogonal to the direction of the current in the write line.

Figure 15:
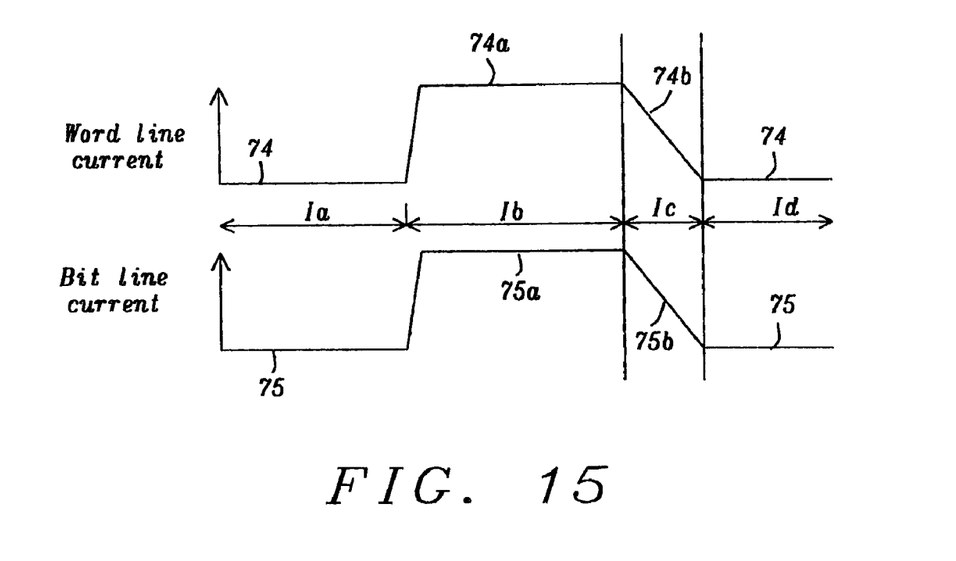
FIGS. 15 and 16 are diagrams showing matched word line current and bit line current pulses having "longer current falling time" and "multi-step falling edges", respectively, which are used to write the toggle MTJ cell depicted in FIG. 13.

In one aspect according to FIG. 15, the word line current and bit line current referred to in FIG. 14 are matched throughout the entire write sequence and reducing the current pulse back to zero comprises a steady linear decrease in a so-called "longer current falling time" approach. The time sequence is divided into four intervals Ia-Ib to demonstrate this method. In interval Ia, neither word line current 74 nor bit line current 75 have a pulse. During interval Ib, a positive (or negative) word line pulse 74a and a matching bit line pulse 75a are applied. The amplitude of the pulses 74a, 75a are equal and sufficient to generate fields 80, 81 or 82, 83 (FIG. 14) that write the memory state of the selected toggle MTJ cells. Moving to interval Ic that typically lasts from about 1 to 10? nanoseconds, the word line current pulse 74b is reduced to zero along a linear slope. Likewise, bit line current pulse 75b is matched to pulse 74b and decreases to zero at the same rate within interval Ic. During interval Id, both word line current 74 and bit line current 75 have no pulse.

Figure 16:
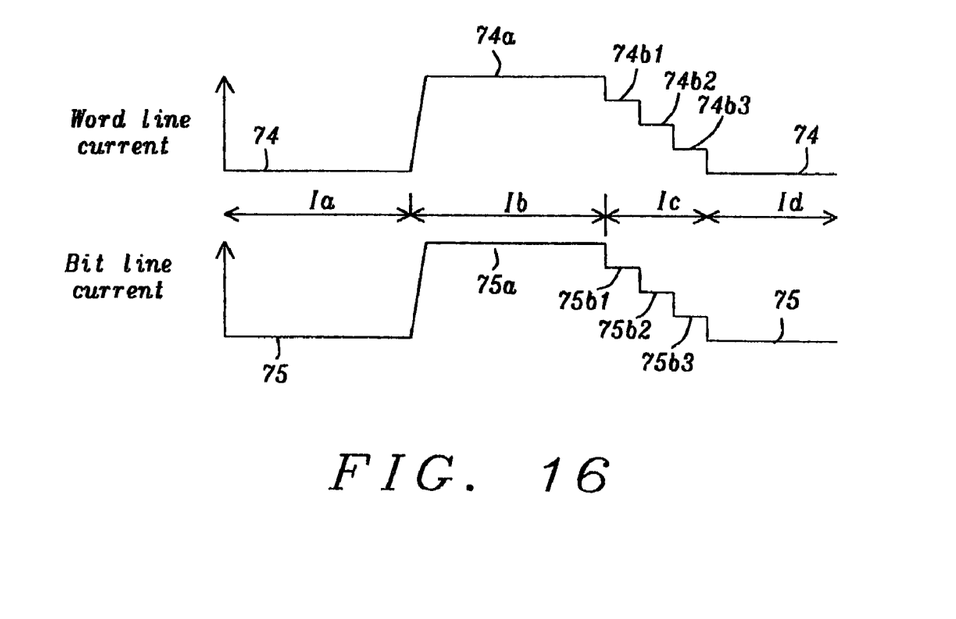

Referring to FIG. 16, an alternative selective write process is shown that is the same as in FIG. 15 except for interval Ic where the word line current and matching bit line current pulses are reduced in a multi-step falling edge process wherein a plurality of steps is used to reduce the word line and bit line pulses back to zero. In other words, the amplitude of the pulse is reduced for a certain time and then held constant for a certain time within each of the plurality of steps. In the example shown in FIG. 16, the word line pulse has three successive steps 74b1, 74b2, 74b3 in interval Ic wherein the order of amplitude of the word line pulse within each step is 74b1>74b2>74b3>0 and bit line pulse has three successive steps 75b1, 75b2, 75b3 wherein the order of amplitude is 75b1>75b2>75b3 >0. Moreover, the amplitude and duration of each of the matching steps are equivalent such that 74b1=75b1, 74b2=75b2, and 74b3=75b3.

One advantage of the present invention is that the toggle MTJ cell described herein does not have half-selected issues as in traditional MRAMs and therefore the written memory states are more stable. A primary advantage over a conventional toggle cell design is that the selected MTJ cells can be written without first reading to determine their magnetic states. This result is achieved by designing different anisotropies in the two or more sub-layers of the SAF free layer and by applying a novel write process that leads to a significant reduction in write cycle time and is highly desirable for high speed applications.

While this invention has been particularly shown and described with reference to, the preferred embodiment thereof, it will be understood by those skilled in the art that various changes in form and details may be made without departing from the spirit and scope of this invention.

I claim:

1. A method of selectively writing to a toggle MTJ cell formed between a bit line and word line in a crossover region in a MRAM array wherein the word line and bit line are aligned at the same 45° to 60° angle relative to an easy axis of a SAF free layer in said toggle MTJ cell, said SAF free layer has a plurality of "n" magnetic sub-layers including an inner sub-layer and an outer sub-layer with equal magnetic moments wherein "n" is an even integer and the inner sub-layer or the outer sub-layer has a greater anisotropy than the other sub-layers, and an anti-parallel coupling layer between adjacent magnetic sub-layers, comprising:
   (a) applying a word line current pulse and a matching bit line current pulse during a first time interval wherein the sum of the magnetic fields generated by said pulses is parallel to the easy axis and is larger than the spin-flop field of the SAF free layer with sufficient margin to write a memory state; and
   (b) reducing the word line current pulse and the bit line current pulse in a matching manner to zero with a falling edge design during a second time interval.

2. The method of claim 1 wherein the sum of the fields generated by the word line current pulse and bit line current pulse is in a first direction along the easy axis and writes a "1" memory state.

3. The method of claim 2 wherein the sum of the fields generated by the word line current pulse and bit line current pulse is in a second direction opposite the first direction and writes a "0" memory state.

4. The method of claim 1 wherein said falling edge design has a "longer current falling time" configuration.

5. The method of claim 1 wherein said falling edge design has a "multi-step falling edge" configuration.

6. The method of claim 1 wherein the sum of the magnetic fields is applied in a direction that is less than an angle of about 10 degrees away from the easy axis.

* * * * *